(12) United States Patent
Chang et al.

(10) Patent No.: US 8,059,438 B2
(45) Date of Patent: *Nov. 15, 2011

(54) CONTENT ADDRESSABLE MEMORY ARRAY PROGRAMMED TO PERFORM LOGIC OPERATIONS

(75) Inventors: Leland Chang, Yorktown Heights, NY (US); Gary S. Ditlow, Yorktown Heights, NY (US); Brian L. Ji, Chappaqua, NY (US); Robert K. Montoye, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 96 days.

This patent is subject to a terminal disclaimer.

(21) Appl. No.: 12/549,740

(22) Filed: Aug. 28, 2009

(65) Prior Publication Data

US 2011/0051482 A1    Mar. 3, 2011

(51) Int. Cl.
    *G11C 15/00*    (2006.01)
(52) U.S. Cl. .................. 365/49.1; 365/163; 365/148
(58) Field of Classification Search ............ 365/49.1, 365/163, 148, 230.06, 203
    See application file for complete search history.

(56) References Cited

U.S. PATENT DOCUMENTS

| | | | |
|---|---|---|---|
| 5,394,353 A * | 2/1995 | Nusinov et al. ............ 365/49.11 |
| 6,166,938 A | 12/2000 | Wong | |
| 7,075,841 B2 | 7/2006 | Resta et al. | |
| 7,130,206 B2 * | 10/2006 | Ferrant ............................ 365/49 |
| 7,236,393 B2 | 6/2007 | Cho et al. | |
| 7,319,608 B2 | 1/2008 | Hsu et al. | |
| 7,365,355 B2 | 4/2008 | Parkinson | |
| 7,397,689 B2 | 7/2008 | Liu et al. | |
| 7,420,841 B2 | 9/2008 | Ruf et al. | |
| 7,499,303 B2 | 3/2009 | Lien et al. | |
| 7,675,765 B2 * | 3/2010 | Derharcobian et al. ... 365/49.17 |
| 2008/0205128 A1 | 8/2008 | Nakai | |
| 2008/0298114 A1 | 12/2008 | Liu et al. | |
| 2009/0040814 A1 | 2/2009 | Kang et al. | |
| 2010/0226161 A1 | 9/2010 | Ji et al. | |

OTHER PUBLICATIONS

Kang et al., "Two-Bit Cell Operation in Diode-Switch Phase Change Memory Cells with 90mm Technology" 2008 IEEE; Symposium on VLSI Technology Digest of Tenicla Papers, pp. 98-99.

* cited by examiner

*Primary Examiner* — David Lam
(74) *Attorney, Agent, or Firm* — Cantor Colburn LLP; Vazken Alexanian

(57) ABSTRACT

A memory device for performing logical operations on two or more input variables includes a match line and first and second memory cells. The first and second memory cells collectively include a first, second, third and fourth memory element. The first, second, third and fourth memory elements may have either a first value or a second value programmed therein and wherein the first, second, third and fourth memory elements are programmed to either the high or low resistive values based on a particular logic function to be performed.

17 Claims, 9 Drawing Sheets

Fig. 5

| R0 $\overline{ab}$ | R1 $\overline{a}b$ | R2 $a\overline{b}$ | R3 $ab$ | ML |
|---|---|---|---|---|
| R | R | R | R | 1 |
| R | R | R | r | $\overline{a}+\overline{b}$ |
| R | R | r | R | $\overline{a}+b$ |
| R | R | r | r | $\overline{a}$ |
| R | r | R | R | $a+\overline{b}$ |
| R | r | R | r | $\overline{b}$ |
| R | r | r | R | $\overline{a}b+a\overline{b}$ |
| R | r | r | r | $\overline{ab}$ |
| r | R | R | R | $a+b$ |
| r | R | R | r | $\overline{ab}+ab$ |
| r | R | r | R | $b$ |
| r | R | r | r | $\overline{a}b$ |
| r | r | R | R | $a$ |
| r | r | R | r | $a\overline{b}$ |
| r | r | r | R | $ab$ |
| r | r | r | r | $0$ |

500 → 
502 
504

CONTENT ADDRESSABLE MEMORY ARRAY PROGRAMMED TO PERFORM LOGIC OPERATIONS

BACKGROUND

The present invention relates to memory devices, and more specifically, to content addressable memory devices.

Random access memory (RAM) associates data with an address. Volatile RAMs such as dynamic RAM (DRAM) and static RAM (SRAM) are traditionally used in today's computers. However, as wireless mobile computing systems become more popular, intensive research and development in the memory area is now focusing on new non-volatile memories. Important non-volatile RAMs known today are ferroelectric RAM (FeRAM) using non-linear capacitance due to different polarization of the lead-zirconium-titanate (PZT) material, magnetic RAM (MRAM) using the magneto-resistance changes with magnetic polarity, and Chalcogenide phase change materials using resistance changes in ordered (conductive) and disordered (resistive) phases.

Content-addressable memory (CAM) is a special type of computer memory used in certain very high speed searching applications. It is also known as associative memory or associative storage. Most existing CAM products are volatile technologies based on SRAM or DRAM cells. CAMS using a resistance-change memory element such as, for example, Chalcogenide phase change materials, have been found to allow for density improvements in the formation of a CAM.

Unlike standard computer memory (e.g., RAM) in which the user supplies a memory address and the RAM returns the data word stored at that address, a CAM is designed such that the user supplies a data word and the CAM searches its entire memory to see if that data word is stored anywhere in it. If the data word is found, the CAM returns a list of one or more storage addresses where the word was found (and in some architectures, it also returns the data word, or other associated pieces of data). Thus, a CAM is the hardware embodiment of what in software terms would be called an associative array.

Binary CAM is the simplest type of CAM which uses data search words comprised entirely of 1s and 0s. Ternary CAM (TCAM) allows a third matching state of "X" or "Don't Care" for one or more bits in the stored dataword, thus adding flexibility to the search. For example, a ternary CAM might have a stored word of "10XX0" which will match any of the four search words "10000", "10010", "10100", or "10110".

A CAM includes memory cells coupled to a match line. Each memory cell typically holds one bit of data. To create a match, each bit of an input word is compared to respective bits stored in the memory cells. In the event that one more of the bits do not match, a value (voltage or current) placed on the match line falls below a threshold value. Such a fall indicates that match does not exist. To that end, the match line may be thought of logically ANDing the values stored in the memory cells.

SUMMARY

According to one embodiment of the present invention, a memory device for performing logical operations on two or more input variables is provided. The memory device includes a match line and a first memory cell coupled to the match line that includes a first and second memory element, each memory element being coupled to a particular logical product of the a first input variable and a second input variable. The memory device also includes a second memory cell coupled to the match line and including a third and fourth memory element, each memory element being coupled to a particular logical product of the first input variable and the second input variable. In this embodiment, the first, second, third and fourth memory elements may have either a first value or a second value programmed therein and wherein the first, second, third and fourth memory elements are programmed to either the high or low resistive values based on a particular logic function to be performed.

In another embodiment of the present invention, a method of performing logical operations between two or more input variables is provided. The method of this embodiment includes providing a first two-bit cell, the first two-bit cell including a first portion and a second portion, wherein the first and second portion both include a memory cell that includes two memory elements; coupling the first two-bit cell to a match line; programming the memory elements to one of two different values based on a particular logical operation to be performed; and monitoring a parameter of the match line to determine a result of the logical operation.

Another embodiment of the present invention is directed to a memory system that includes a content addressable memory including a first memory cell coupled to a match line and including a first and second memory element, each memory element being coupled to a particular logical product of the a first input variable and a second input variable, and a second memory cell coupled to the match line and including a third and fourth memory element, each memory element being coupled to a particular logical product of the first input variable and the second input variable, wherein the first, second, third and fourth memory elements may have either a first value or a second value programmed therein and wherein the first, second, third and fourth memory elements are programmed to either the high or low resistive values based on a particular logic function to be performed. The memory system also includes a match checking device coupled content addressable memory that determines if a particular input applied to the content addressable memory provides a logical 1 or logical zero as an output and a decoder coupled to the content addressable memory that receives an input address and decodes at least two of the bits from the address into four unique outputs.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 5 shows a table that may be utilized in the programming of two-bit cells in order to perform logical operations;

DETAILED DESCRIPTION

Figure 1:
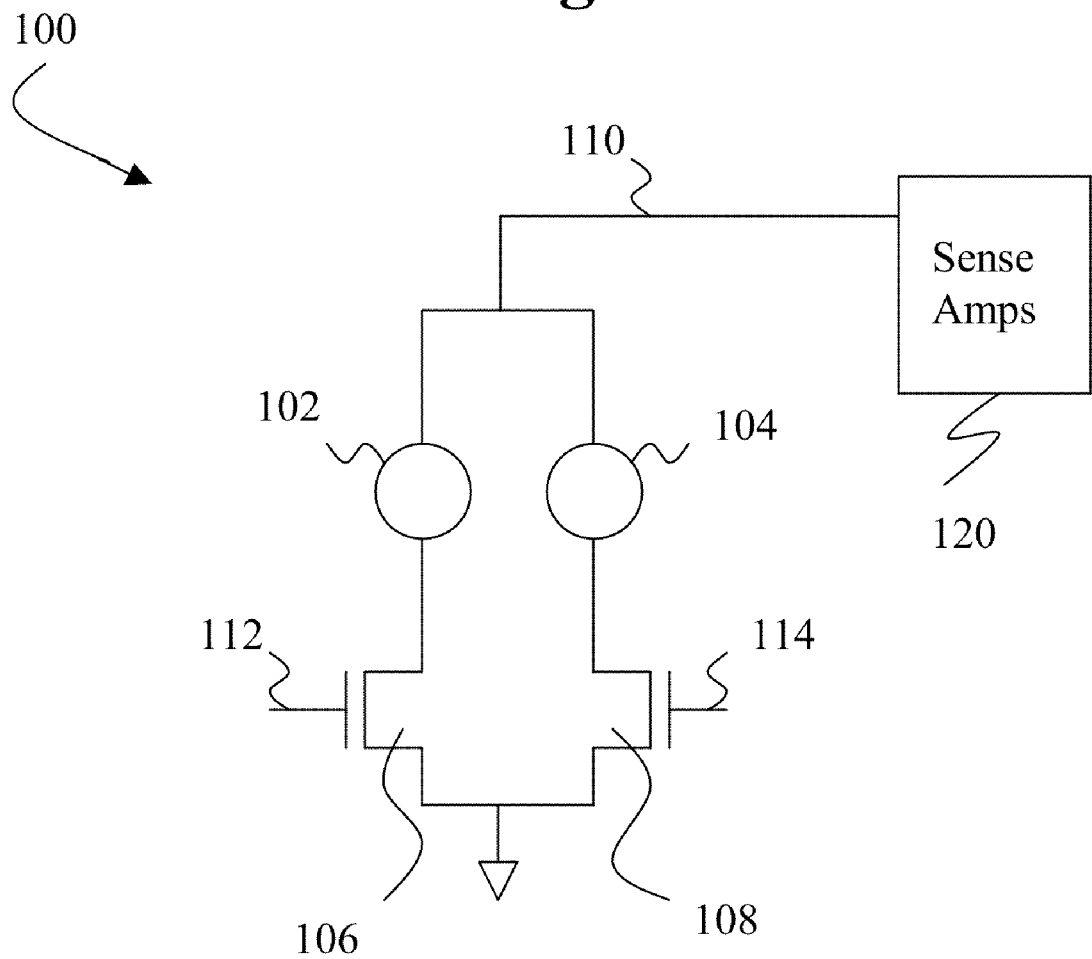
FIG. 1 shows an example of a memory cell for use in a CAM.

An example of a memory cell 100 for use in a CAM is shown in FIG. 1. The memory cell 100 shown in FIG. 1 may be a ternary CAM cell in one embodiment. The memory cell 100 includes a first memory element 102 and a second memory element 104. The first resistive memory element 102 and second memory element 104 are electrically coupled in parallel to a match line 110. The match line 110 may also be utilized as a bit-line in some embodiments. The first memory element 102 and the second memory element 104 may be formed as, for example, a phase change memory element. Phase change material can be utilized to store information in CAM devices and, accordingly may be used as the memory elements in some embodiments. Phase change materials can be manipulated into different phases or states, with each phase representing a different data value. Generally, each phase exhibits different electrical properties. The amorphous and crystalline phases are typically two phases used for binary data storage (1's and 0's) since they have detectable differences in electrical resistance. In a particular configuration of the invention, the first and second memory elements are phase change elements comprised of a phase change material, such as Germanium-Antimony-Tellurium (GST). The memory elements may be programmed to one of two states: a crystalline state or an amorphous state. In the crystalline state (SET), the memory elements exhibit relatively low resistances and require less current to be programmed to. On the other hand, in the amorphous state (RESET), the memory elements have relatively high resistances and require more current to be programmed to. The resistance states of the first and second memory elements are used to store a data bit in a data word. For example, to store a data bit with a low ternary data value, the first memory element is programmed to the low resistance state and the second memory element is programmed to the high resistance state.

Other possibilities for the memory elements include, but are not limited to, resistive memory elements, floating gate field effect transistors (floating gate FETs), Magnetoresistive Random Access Memory (MRAMs), or a charge trapping device.

The memory cell 100 includes a first access device 106 electrically coupled to the first memory element 102, a first access line 106 and a common ground. The memory cell 100 also includes a second access device 108 electrically coupled to the second memory element 108, a second access line 114, and the common ground. The first access device 106 and the second access device 108 may be comprised of, but not limited to, field effect transistors (FET), or bipolar junction transistors (BJT). In one configuration of the invention, the access devices 108 and 110 include source, drain and common terminals. The source terminals of the access devices 106 and 108 are electrically coupled together and to the common ground. The drain terminal of the first access device 106 is electrically coupled to the first memory element 102. The drain terminal of the second access device 108 is electrically coupled to the second memory element 104. The gate terminal of the first access device 106 is electrically coupled to the first access line 114, which functions as the word line during the data storage operation. During a search operation, the first access line also functions as the complementary search line. The gate terminal of the second access device 104 is electrically coupled to the second access line 114, which functions as the complementary word line during the data storage operation and as a search line during a search operation.

As shown, the memory cell 100 may have 4 possible states based on the programming of the first memory element 102 and second memory element 104. These combinations are RR, Rr, rR, and rr where R is high resistance (logical 0) and r is a low resistance (logical 1). These combinations may be used to create the states shown below in Table 1 where the cell state X is the so called "don't care" state.

TABLE 1

| Cell State | First Element Resistive State | Second Element Resistive State |
|---|---|---|
| X | High | High |
| 0 | High | Low |
| 1 | Low | High |

In operation, to read (also referred to as matching) the state of the memory cell 100, the match line 110 is first pre-charged. Next, a particular value (0, or 1) is applied to the first access line 112 and the second access line 114. In most cases, the first access line 112 forms the complement of the second access line 114. That is, if "a" is applied to the second access line 114, a value of "a*" (the complement of a) is applied to the first access line 112. This may be referred to as complementary addressing herein.

To compare the value stored in the cell to a logical "0", the first access line 112 is driven high and the second select line 114 is driven low. To compare the value stored in the cell 100 to a logical "1" the first select line 112 is driven low and the second select line 114 is driven high. In the case that the comparison to be made is with a "don't care," the values placed on the select lines are irrelevant because both resistors are high valued and will keep the resistance of the match line resistance high.

When the value stored in the cell 100 does not match, the resistance level of the match line 110 falls. For example, assuming that cell 100 is storing a value of 1, the first memory element 102 is in a low resistance state and the second memory element 104 is in a high state. Application of a logical 0 to the access lines (first access line 112 high, second access line 114 low) opens the first access device 106 and, because the first resistor 102 is in a low resistance state, reduces the resistance level of the match line. This lower resistance indicates that a match has not been found.

Of course, in most instances, many cells are connected to a particular match line 110. If one of the cells does not match the value of the bit provided to it on the access lines 112 and 114, the resistance level of the match line 110 falls. Thus, it may be determined if any cell is not matched by monitoring the resistance level of the match line 110. The resistance (measured as a voltage or current) may be determined by a sense amp 120.

As discussed above, the match line may be thought of logically ANDing the values stored in the memory cells connected thereto.

Figure 2:
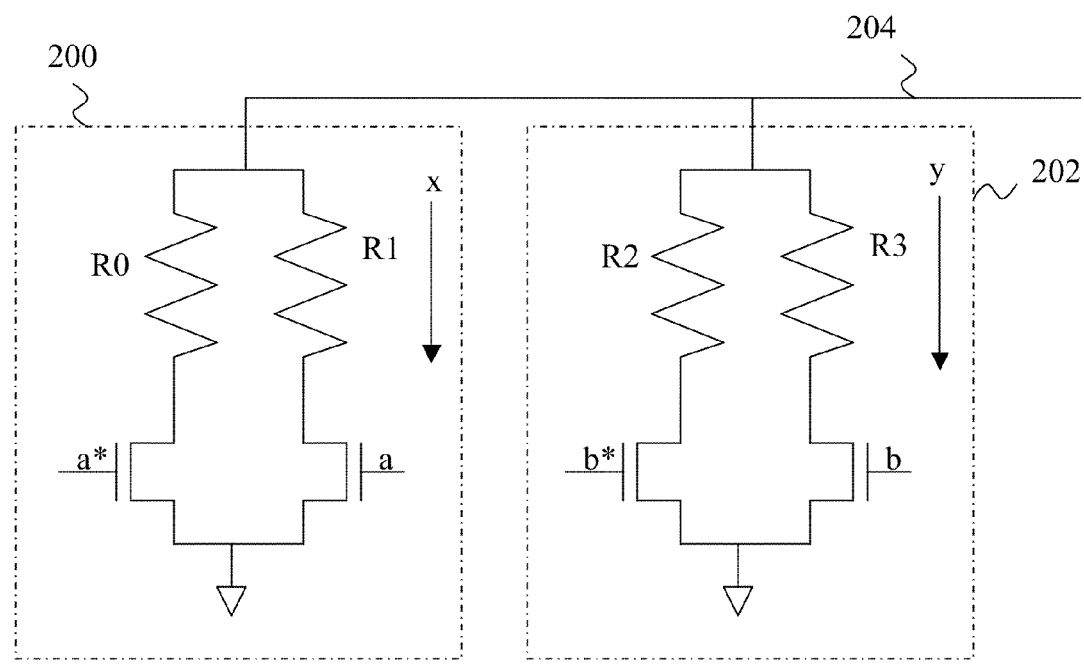
FIG. 2 shows an example of two memory cells coupled to a match line.

FIG. 2 shows an example of two CAM cells that may be addressed individually. The first cell 200 and second cell 202 are both connected to match line 204. Each cell includes two memory elements shown as resistors to emphasize the resistive properties of the memory elements in one embodiment.

The inputs to the access/select lines for the first cell 200 are shown as receiving signals a and a* and the access/select lines of the second cell 202 are shown as receiving b and b* where the * indicates that the signal is the complement of the original signal. In the event that a match between the inputs and the bit stored for both cells 200 and 202 occurs, a pathway through a high resistance resistor from the match line 204 to ground is created in each cell.

From the above description, it will be apparent that each time a cell matches the inputs it is receiving, the cell provides a path through a high resistance state resistive element to ground. As more cells are coupled to the match line 204, the resistive value of the match line decreases for a match condition because the resistors are in parallel for the match condition. For example, two arbitrary examples are shown with pathways x and y in FIG. 2. In short, one of two pull down paths are active for each 1 bit cell coupled to the match line 204 for every matching cell. This reduction in resistance state moves the match and no match conditions closer together and, therefore, makes differentiating match and no match conditions more difficult.

Each cell includes a first and second match line. In this example, two bits a and b are connected to the first cell 200 and the second cell 202, respectively. The bits a and b are decoded to include a* and b*. This shall be referred to herein as 1 to 2 bit decoding. That is, a decodes to a and a*. In FIG. 2, the resistive elements in the two memory cells 200 and 202 are referred to as R0, R1, R2 and R3.

Selection of the values of R0, R1, R2 and R3 may allow the match line 204 to effectively act as the representation of a logical operation. That is, selecting R0, R1, R2 and R3 in all of the possible different configurations (16), allows for match line 204 to equal the result of an AND operation on the inputs. Table 1 shows the possible values of R1-R3 and the resulting value (shown as a 1, a 0 or a logical AND of two inputs) on the match line 204. In the tables and figures herein a variable with a line over it shall mean the same as a variable followed by an *. That is, the line (bar) represents the complement of the original variable.

TABLE 2

| R0 $\bar{a}$ | R1 a | R2 $\bar{b}$ | R3 b | ML |
|---|---|---|---|---|
| R | R | R | R | 1 |
| R | R | R | r | $\bar{b}$ |
| R | R | r | R | b |
| R | R | r | r | 0 |
| R | r | R | R | $\bar{a}$ |
| R | r | R | r | $\bar{a}b$ |
| R | r | r | R | $\bar{a}b$ |
| R | r | r | r | 0 |
| r | R | R | R | a |
| r | R | R | r | $a\bar{b}$ |
| r | R | r | R | ab |
| r | R | r | r | a |
| r | r | R | R | 0 |
| r | r | R | r | 0 |
| r | r | r | R | 0 |
| r | r | r | r | 0 |

The sixteen possible R1-R3 combinations yield 10 definitive values and 6 zero values. The six zero values lead to ambiguity in discerning various results and also limits the logical operations that may be performed by a single match line.

Consider for example the following logical algebra related to the function $f$.

$$f = (a \oplus b)(c + d)$$
$$= (\bar{a}b + a\bar{b})(c + d)$$
$$= \bar{a}bc + \bar{a}bd + a\bar{b}c + a\bar{b}d$$
$$= f_0 + f_1 + f_2 + f_3$$

Placing $f_0, f_1, f_2$ and $f_3$ into a decode table yields:

|    | a | b | c | d |
|----|---|---|---|---|
| f0 | 0 | 1 | 1 | — |
| f1 | 0 | 1 | — | 1 |
| f2 | 1 | 0 | 1 | — |
| f3 | 1 | 0 | — | 1 |

Substituting in the resistive values shown in Table 1 into this decode table shows the values of the resistors of the memory elements associated with variables a, b, c and d and yields:

|    | $\bar{a}$ a | $\bar{b}$ b | $\bar{c}$ c | $\bar{d}$ d |
|----|------|------|------|------|
| f0 | R r  | r R  | r R  | R R  |
| f1 | R r  | r R  | R R  | r R  |
| f2 | r R  | R r  | r R  | R R  |
| f3 | r R  | R r  | R R  | r R  |

Figure 3:
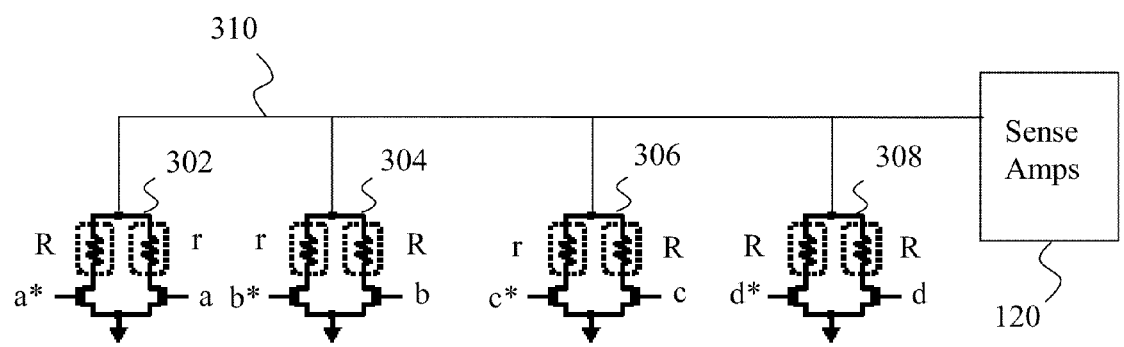
FIG. 3 shows four one bit cells coupled to a match line.

FIG. 3 shows one embodiment of the present invention that includes a first memory cell 302 a second memory cell 304, a third memory cell 306 and fourth memory cell 308 all coupled to match line 310. These memory cells 302, 304, 306 and 308, respectively, store the logical operators associated with the variable a, b, c, and d shown in the immediately preceding decode table. The function $f_0$ in the immediately preceding decode table is represented by the match line 310. In one embodiment, the resistive elements of the memory cells are formed of phase change materials an all include two resistive elements.

In particular, the first memory cell 302 is coupled to a* and a and has resistive values of R and r as viewed from left to right. The second memory cell 304 is coupled to b* and b and has resistive values of r and R as viewed from left to right. The third memory cell 306 is coupled to c* and c and has resistive values of r and R as viewed from left to right. Finally, the fourth memory cell 308 is coupled to d* and d and has resistive values of R and R as viewed from left to right. The match line 310 is coupled to sense amps 120.

It shall be understood that each of the four functions $f_0$ to $f_3$ requires its own match line. Accordingly, to implement the function $f$ the results of four separate match lines are needed. In the event that any of these match lines are high, a match will have been found.

In one embodiment of the present invention, rather than the single bit cells shown in the above description a two-bit cell may be utilized. In one embodiment, for example, 4 variables (a, b, c and d) are applied to two-bit cells. In general, a two-bit cell has the four select lines. According to one embodiment, each select line receives one of the four possible combinations of two variables, each having a complement.

Figure 4:
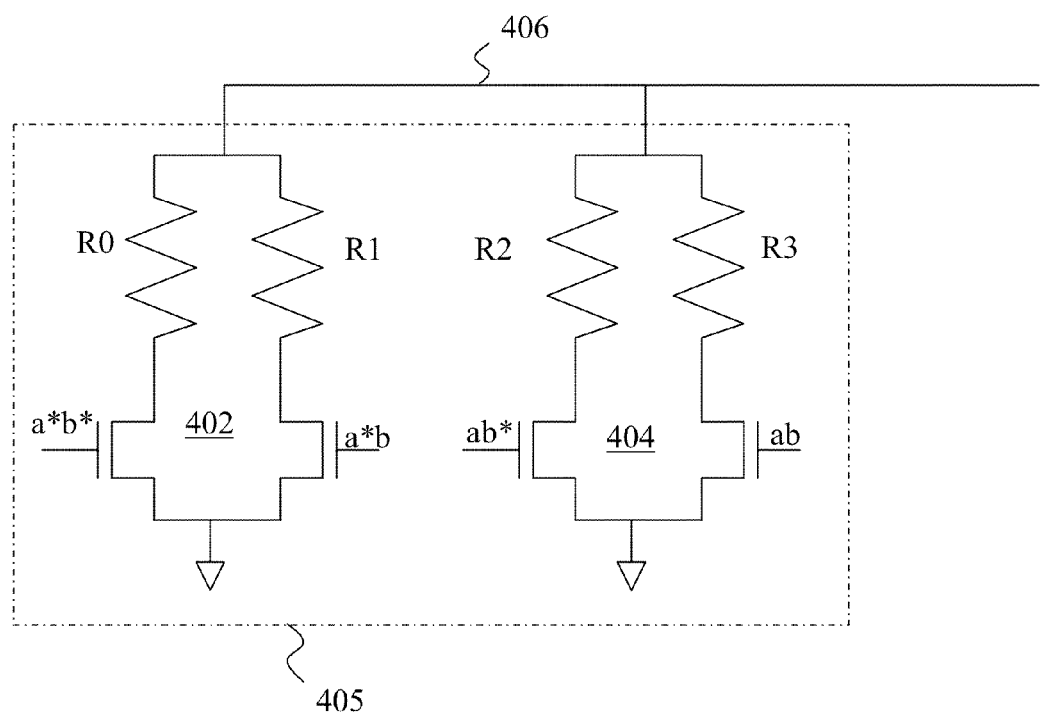
FIG. 4 shows and example of two memory cells coupled to match line where the two memory cells form a 2-bit cell according to one embodiment of the present invention.

FIG. 4 shows memory cells 402 and 404 combined into what may be referred to herein as a 2-bit cell 405. The memory cells are coupled to a match line 406. In this embodiment, the select lines for each cell may include a combination of the inputs that would have otherwise been used to select the cells individually. For example, the inputs could be, a*b*, a*b, ab*, and ab. As used herein, when two variables are expressed as xy, that expression represents the result of an AND operation performed on the two values. For example, if a=1 and b=0, ab=0, and if a=1 and b=1, ab=1. Of course, other input schemes could be utilized consistent with the present invention.

In FIG. 4, the a*b* input is related to resistive element R0, input a*b is related to resistive element R1, input ab* is related to resistive element R2 and, and ab is related to resistive element R3.

Considering that the two cells may each have a 1 or a 0 stored therein, there exists 4 possible combinations of the values collectively stored in the two cells: 00, 01, 10 and 11. Table 4 shows the possible desired match values for a combination of the two cells and the resulting values that may be applied to the select lines in the embodiment shown in FIG. 4. The match values are an ordered pair of the bits to be compared to the first cell 402 and the second cell 404, respectively.

TABLE 3

| Match Values | a | a* | b | b* | a*b* | a*b | ab* | ab |
|---|---|---|---|---|---|---|---|---|
| 00 | 0 | 1 | 0 | 1 | 1 | 0 | 0 | 0 |
| 01 | 0 | 1 | 1 | 0 | 0 | 1 | 0 | 0 |
| 10 | 1 | 0 | 0 | 1 | 0 | 0 | 1 | 0 |
| 11 | 1 | 0 | 1 | 0 | 0 | 0 | 0 | 1 |

Table 4 is effectively a 2 input to 4 output decoder. The actual decoding may be done, for example, in hardware, software, or a combination of both. Of course, the exact decoding scheme utilized may vary without departing from the present invention.

The match line 406 in the example shown in FIG. 4 may allow for logically ANDing, ORing, XORing and XNORing of inputs a and b. As discussed above, the matchline of the prior art could only AND bits together. The matchline of the present invention may to AND as well as OR operations between bits. Accordingly, the matchline of the present invention may be referred to as an AND OR AND matchline.

FIG. 5 is a table 500 that shows the possible combinations of resistive values that may be applied to each input and the logical value of the match line associated therewith. The first portion 502 of the table 500 includes, row by row, every possible combination of the resistive values of four resistive elements that may be included, for example, in two bit cell as shown, for example, FIG. 4. Each column of the first portion 502 is assigned one of the four inputs provided to the two bit cell of FIG. 4. The table 500 also includes a second portion 504. The second portion 504 shows the logical value of the match line given the particular inputs and configuration of the resistive elements. That is, for example, to create a match line that creates a signal that indicates the results anding a*b the resistive elements R0-R3 would be formed as r, R, r, r. Thus, to perform any of the logical operation shown in the second portion 502, the corresponding row in the first portion 502 is used to determine the programming of the resistive elements.

It should also be noted that all 16 entries in second portion 504 are unique. This is in contrast to the Table 2 above that has 6 non-unique entries. Accordingly, utilizing the 2 bit addressing shown in FIG. 4 provides for more logical functions from the same basis hardware. A brief example may show further advantages of utilizing the two-bit addressing scheme in combination with the table 500.

Consider again the function $f$ shown above. $f$ reduces to the second equation shown below.

$$f = (a \oplus b)(c + d)$$
$$= (\bar{a}b + a\bar{b})(c + d)$$

Figure 6:
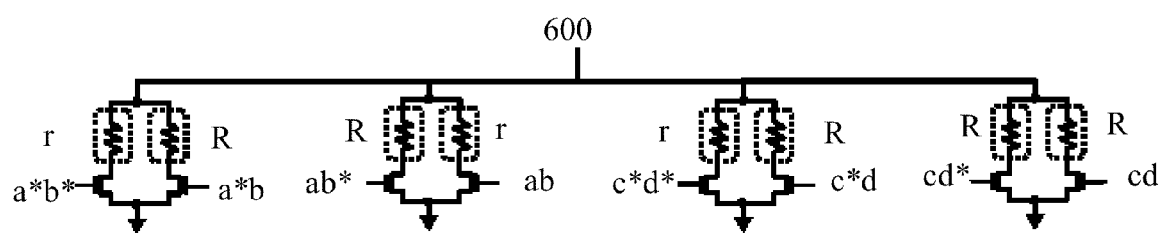
FIG. 6 shows two two-bit cells coupled to a match line and addressed to perform logical operations according to an embodiment of the present invention.

Utilizing the table 500 shown in FIG. 4 the first portion of $f$, (a XOR b) (which may be represented as (a*b+ab*)) may be implemented by selecting the resistive values rRRr. Similarly, the second portion (c+d) may be implemented as rRRR. Placing two two-bit cells so programmed on the same match line yields the ANDing of these two two-bit cells. As such, a single match line is used to perform the function. This leads to a roughly 4 to 1 reduction in hardware from the single bit cell example shown above which required 4 match lines to implement $f$. An example of a match line. 600 having cells programmed as just described is shown by way of example in FIG. 6.

Figure 7:
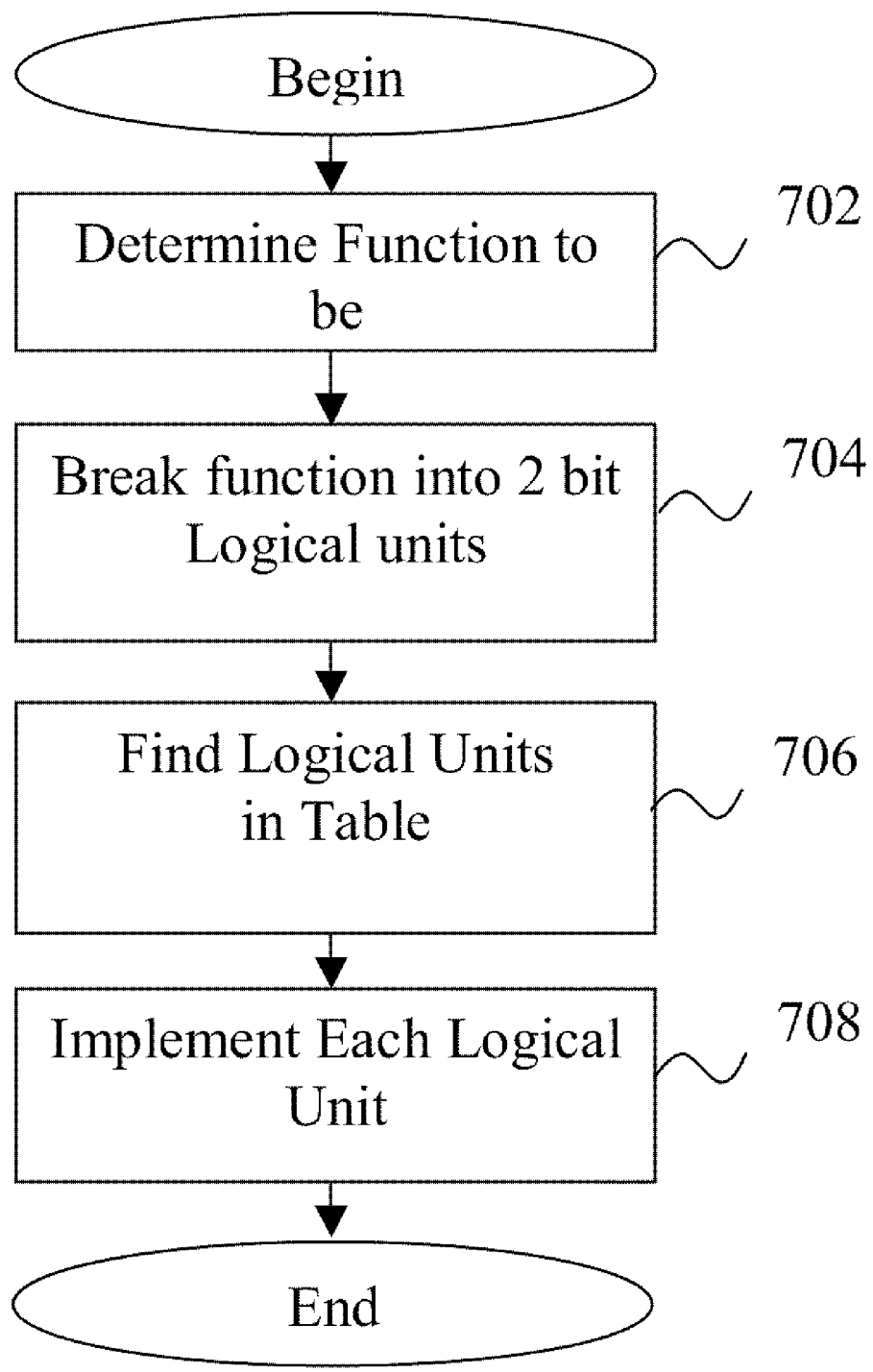
FIG. 7 is a flow chart of a method according to an embodiment of the present invention.

FIG. 7 shows a flowchart of a method of creating a logical function from one or more two-bit cells according to one embodiment of the present invention. At a block 702 the logical function to be evaluated is determined. For example, the logical function may be the function $f$ shown above. Of course, the function is not so limited and may be any function. As long as the function has two or more variables (such as, for example, a, b, c, and d above) the teachings herein may be applicable.

At a block 704 the function is broken into two-bit logical inputs. That is, function may need to be manipulated using standard logical algebra operations such that each minterm contains only two different input variable.

At a block 706, each minterm is found in a table and the corresponding resistive values are located. These resistive values are then implemented for each minterm in hardware at a block 708.

The above description has dealt with a 2-bit cell. It shall be understood that these teachings could also be applied to any number of bit cells. For example, each cell could contain three one-bit cells and a 3-8 decoder may be used. In general sense, the number of bits that may be grouped is not limited and, accordingly, the decoder may be an n to $2^n$ decoder where n is the number of grouped bits.

The following description provides an example application for the teachings herein. The description is meant to be illustrative only and is not meant as limiting in any respect.

Figure 8:
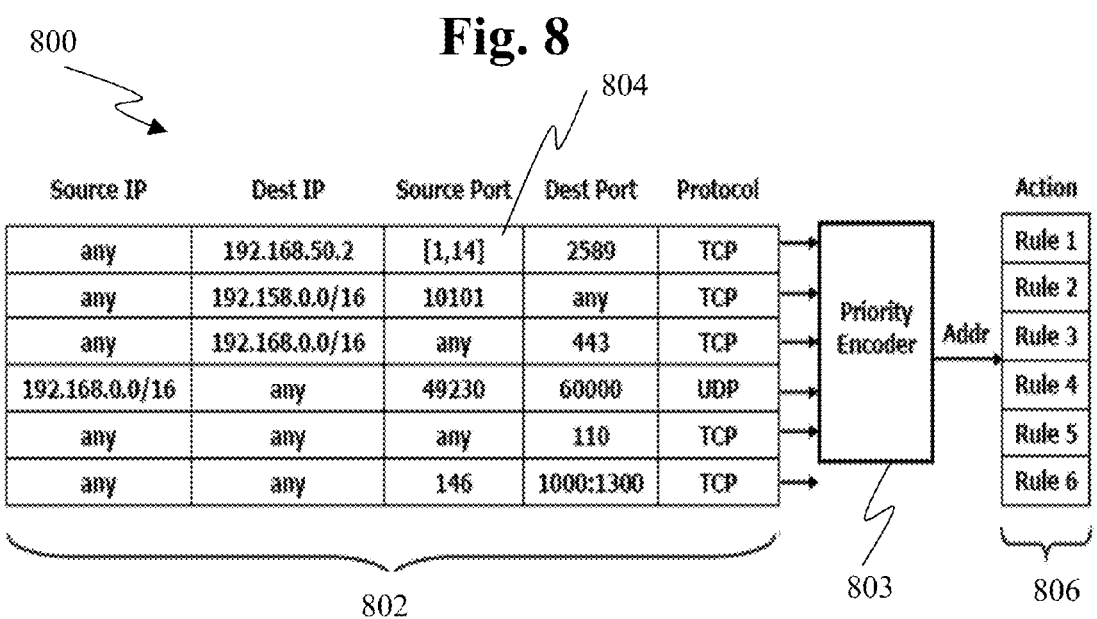
FIG. 8 is a block diagram of system according to one embodiment of the present invention.

Referring now to FIG. 8, one example application of the teachings herein may be utilized in the context of packet classification in a system 800 for intrusion detection. In the system 800, an associative array 802 is loaded with classification rules for Internet packets. The associative array 802 may, in one embodiment, be a CAM or ternary CAM. In operation, when a packet matches entries in the associative array 802 a priority encoder 803 determines the highest priority match that the packet presented. That is, a packet may satisfy multiple rows of the associative array 802. Accordingly, in such a situation, multiple match lines 805 from the associative array 802 may indicate a match.

Regardless, depending on which match line 805 is selected, the encoder passes an address to a memory element 806 (e.g., an SRAM) that includes multiple rules. These rules may determine an action to be performed such as, for example, deny, accept, log intrusion, etc.). In the embodiment shown, each rule is associated with a particular match line.

Notice is taken of the first row of the associative array 802 that includes a cell 804 that provides a range (1-14). In the prior art, to determine if one of the 14 possible permutations of this row matched 14, rows (match lines) may have been required, one for each possible value in the range. Utilizing an X (don't care) may reduce this to six rows (0001, 001X, 01XX, 10XX, 110X and 1110) but six separate rows in a CAM would still be required. If, however, the teachings herein are utilized, only two rows may be needed.

Specifically, the six rows may be represented in the following truth table:

|        | x8 | x4 | x2 | x1 |
|--------|----|----|----|----|
| [1]    | 0  | 0  | 0  | 1  |
| [2, 3] | 0  | 0  | 1  | —  |
| [4, 7] | 0  | 1  | —  | —  |
| [8, 11]| 1  | 0  | —  | —  |
| [12, 13]| 1 | 1  | 0  | —  |
| [14]   | 1  | 1  | 1  | 0  |

The above truth table has the binary bit value across the top and the outputs are defined as ranges (for instance [4,7] represent the values 4, 5, 6, and 7). Converting the above truth table yields the following 4 variable Karnaugh map:

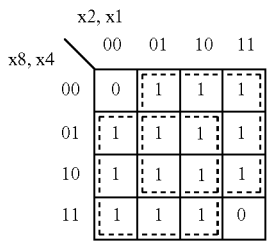

The above Karnaugh map yields the following equation:

$$f=(\overline{x_8}+\overline{x_4})(x_2+x_1)+(x_8+x_4)(\overline{x_2}+\overline{x_1})$$

The first portion of the above equation may be represented (based on the utilizing the table in FIG. 5) by programming a first row in a CAM with (RRRr, rRRR) and the second portion in a second row as (rRRR, RRRr). Accordingly, the range of 1-14 may be implemented in 2 rows, instead of 14 or 6 as would have been required in prior art.

Figure 9:
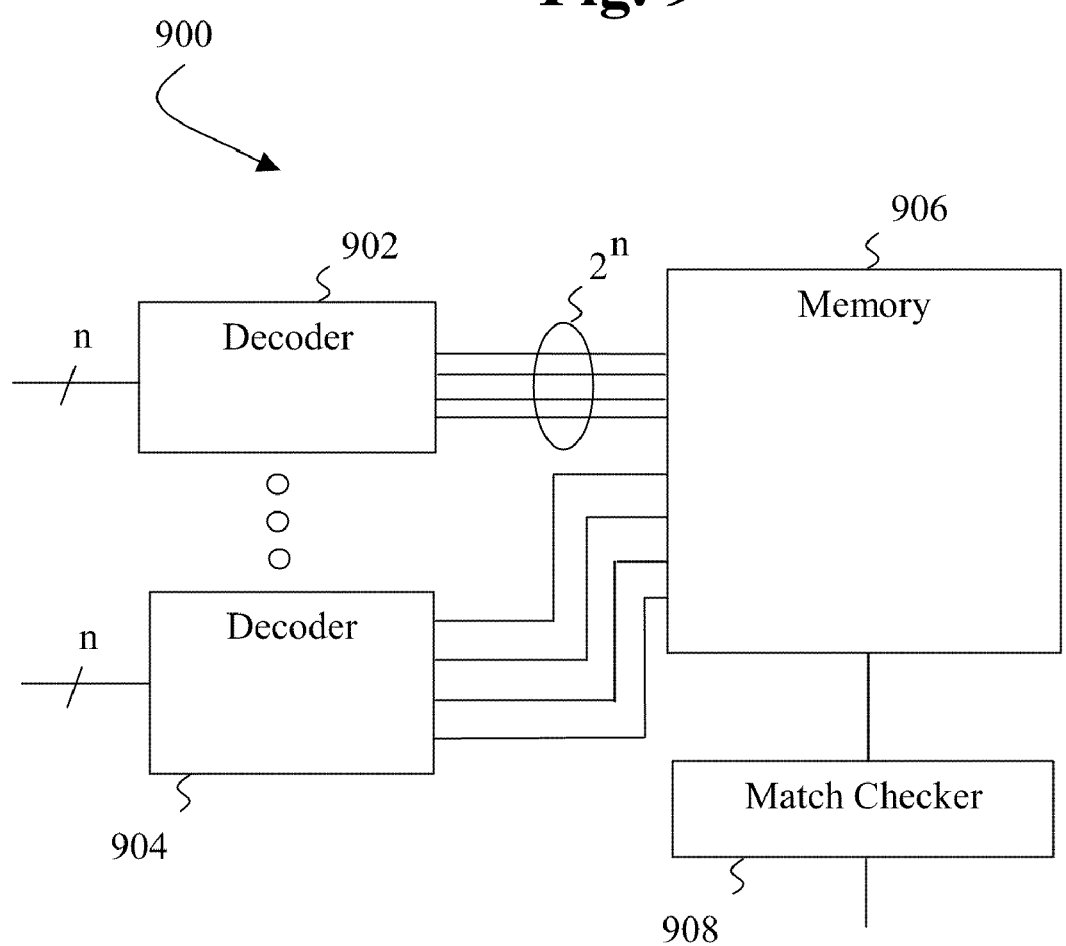
FIG. 9 is a block diagram of a system in which the present invention may be implemented.

FIG. 9 shows a block diagram of a system 900 in which the present invention may be implemented. The system includes a decoder 902. The decoder 902 receives an input vector and converts it into coded inputs for individual memory cells within the memory 906. It shall be understood, that the decoder converts n input bits into $2^n$ input bits in one embodiment. In such an embodiments, each grouping of bits may include its own decoder. Accordingly, the system 900 may include any number of decoders and FIG. 9 shows two decoders 902 and 904. The decoders may be implemented in hardware, software, or a combination of both.

The system 900 may also include a memory 906. In one embodiment, the memory 900 may be a CAM. In another embodiment, the memory 900 may be a ternary CAM. In either embodiment, the memory may be constructed of a plurality of cells such as those described with respect to FIG. 1 and having one or more match lines that couple them together.

The system 900 may also include a match checker 908 that determines if the input vector matches an address stored in the memory 906. This may be determined, for example, by measuring a resistance level of one or more match lines contained in the memory 900.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A memory device for performing logical operations on two or more input variables, the memory device comprising:
   a match line;
   a first memory cell coupled to the match line and including a first and second memory element, each memory element being coupled to a particular different logical product of a first input variable and a second input variable; and
   a second memory cell coupled to the match line and including a third and fourth memory element, each memory element being coupled to a particular logical product of the first input variable and the second input variable;
   wherein the first, second, third and fourth memory elements may have either a first value or a second value programmed therein and wherein the first, second, third and fourth memory elements are programmed to either the high or low resistive values based on a particular logic function to be performed.

2. The memory device of claim 1, wherein the memory device is content addressable memory and wherein the first value may be a logical 1 or a logical 0 and the second value may be a logical 1 or a logical 0.

3. The memory device of claim 1, wherein the memory device is a ternary content addressable memory and where in the first value may be a logical 1, a logical 0 or a don't care and the second value may be a logical 1, a logical 0 or a don't care.

4. The memory device of claim 3, wherein the first, second, third and fourth memory elements are formed of a phase change material.

5. The memory device of claim 1, further comprising:
four transistors, each transistor being coupled to a different one of the first, second, third and fourth memory elements and each having an access lines and wherein the access line of each transistor is coupled to the logical product of the first and second values.

6. The memory device of claim 5, wherein:
a first access line of a first of the four transistors is coupled to a combination of a complement of the first value and a complement of the second value;
a second access line of a second of the four transistors is coupled to a combination of the complement of the first value and the second value;
a third access line of a third of the four transistors is coupled to a combination of the first value and the complement of the second value; and
a fourth access line of a fourth of the four transistors is coupled to the first value and the second value.

7. The memory device of claim 1, further comprising:
a third memory cell coupled to the match line and including a fifth and sixth memory element, each memory element being coupled to a particular logical product of a third input variable and a fourth input variable; and
a fourth memory cell coupled to the match line and including a seventh and eighth memory element, each memory element being coupled to a particular logical product of the third input variable and the fourth input variable.

8. The memory device of claim 7, wherein the third and fourth memory cells are both activated by transistors having access lines coupled to a logical product of a third input and a fourth input.

9. A method of performing logical operations between two or more input variables, the method comprising:
providing a first two-bit cell, the first two-bit cell including a first portion and a second portion, wherein the first and second portions both include a memory cell that includes two memory elements;
coupling the first two-bit cell to a match line;
coupling a first logical product of a first input variable and a second input variable to a cell in the first portion and coupling a second logical product of the first input variable and the second input variable to a cell in the second portion, the first and second logical product being different from one another;
programming the memory elements to one of two different values based on a particular logical operation to be performed; and
monitoring a parameter of the match line to determine a result of the logical operation.

10. The method of claim 9, further comprising:
receiving an input vector at a decoder;
decoding the input vector, decoding including performing on logical operations on at least a portion of the input vector to create a plurality of selection values; and
transmitting the selection values to access lines coupled to first two-bit cell.

11. The method of claim 10, further comprising:
precharging the match line.

12. The method of claim 9, wherein programming includes matching desired logic function to a pattern of resistive values for the memory elements contained in a table.

13. The method of claim 9, further comprising:
providing a second two-bit cell, the second two-bit cell including a third portion and a fourth portion, wherein the third and fourth portion both include a memory cell that includes two memory elements;
coupling the second two-bit cell to a match line; and
programming the memory elements of the second two-bit cell to one of two different values based on a particular logical operation to be performed.

14. A memory system comprising:
a content addressable memory including a first memory cell coupled to a match line and including a first and second memory element, each memory element being coupled to a different particular logical product of the a first input variable and a second input variable, and a second memory cell coupled to the match line and including a third and fourth memory element, each memory element being coupled to a particular logical product of the first input variable and the second input variable, wherein the first, second, third and fourth memory elements may have either a first value or a second value programmed therein and wherein the first, second, third and fourth memory elements are programmed to either the high or low resistive values based on a particular logic function to be performed;
a match checking device coupled to the content addressable memory that determines if a particular input applied to the content addressable memory provides a logical 1 or logical zero as an output; and
a decoder coupled to the content addressable memory that receives an input address and decodes at least two of the bits from the address into four unique outputs.

15. The system of claim 14, wherein the first value may be a logical 1 or a logical 0 and the second value may be a logical 1 or a logical 0.

16. The system of claim 14, wherein the first value may be a logical 1, a logical 0 or a don't care and the second value may be a logical 1, a logical 0 or a don't care.

17. The system of claim 14, wherein the first, second, third and fourth memory elements are formed of a phase change material.

* * * * *